US008022687B2

(12) United States Patent
Ortler

(10) Patent No.: US 8,022,687 B2
(45) Date of Patent: *Sep. 20, 2011

(54) SECUM-TRAHENZ METHOD, ESPECIALLY FOR A NETWORK ANALYZER, FOR MEASUREMENT OF A DEVICE

(75) Inventor: Georg Ortler, Gessertshausen (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 726 days.

This patent is subject to a terminal disclaimer.

(21) Appl. No.: 12/063,752

(22) PCT Filed: Jan. 5, 2007

(86) PCT No.: PCT/EP2007/000070
§ 371 (c)(1),
(2), (4) Date: Mar. 20, 2008

(87) PCT Pub. No.: WO2007/080072
PCT Pub. Date: Jul. 19, 2007

(65) Prior Publication Data
US 2010/0141239 A1    Jun. 10, 2010

(30) Foreign Application Priority Data

Jan. 10, 2006  (DE) .................... 10 2006 001 284
Feb. 15, 2006  (DE) .................... 10 2006 007 042
Apr. 11, 2006  (DE) .................... 10 2006 017 018

(51) Int. Cl.
*G01R 23/14* (2006.01)
*G01R 27/32* (2006.01)
*G01R 27/28* (2006.01)

(52) U.S. Cl. ................... 324/76.23; 324/638; 324/650
(58) Field of Classification Search ............. 324/601, 324/76.23, 638, 650
See application file for complete search history.

(56) References Cited

U.S. PATENT DOCUMENTS

| 4,274,047 A | 6/1981 | Hecken |
| 4,647,847 A | 3/1987 | Roos |
| 4,916,383 A | 4/1990 | Sayers et al. |
| 5,089,782 A | 2/1992 | Pike et al. |

(Continued)

FOREIGN PATENT DOCUMENTS

DE    40 09 750    10/1991

(Continued)

OTHER PUBLICATIONS

International Search Report for PCT/EP2007/000070, dated Mar. 29, 2007.

*Primary Examiner* — Amy He
(74) *Attorney, Agent, or Firm* — Marshall, Gerstein & Borun LLP

(57) ABSTRACT

The invention relates to a method for measuring objects for measurement, by means of a network analyzer with several measurement ports, at least one signal generator, for stimulating the object for measurement and at least one local oscillator, for measurement of the signal transmitted or reflected from the object for measurement by the superposition principle. According to the invention, on a frequency change, only the frequency of the local oscillator or the frequency of the signal generator is changed but not the frequency of the local oscillator and the signal generator simultaneously.

8 Claims, 2 Drawing Sheets

U.S. PATENT DOCUMENTS

| | | |
|---|---|---|
| 5,132,630 A | 7/1992 | Danzeisen |
| 6,157,183 A | 12/2000 | Bradley |
| 6,549,862 B1 | 4/2003 | Huang et al. |
| 6,970,000 B2 | 11/2005 | Evers et al. |
| 7,231,311 B2 * | 6/2007 | Verspecht ................ 702/124 |

FOREIGN PATENT DOCUMENTS

| | | |
|---|---|---|
| DE | 689 10 870 | 6/1994 |
| DE | 102 46 700 | 4/2004 |
| DE | 103 31 092 | 2/2005 |

* cited by examiner

SECUM-TRAHENZ METHOD, ESPECIALLY FOR A NETWORK ANALYZER, FOR MEASUREMENT OF A DEVICE

BACKGROUND OF THE INVENTION

1. Field of the Invention

The invention relates to a method, which allows a phase-stable frequency change of the signal generator and of the local oscillator, for example, of a network analyzer. Within the context of the present application, this method is referred to as the Secum-Trahenz method.

2. Related Technology

A vectorial network analyzer with controllable signal generators and controllable oscillators is known from DE 102 46 700 A1. Only a single local oscillator is often provided in the network analyzers used in practice. Several signal generators are generally provided in more-recent network analyzers with more than two test ports. For example, with a network analyzer comprising three test ports, two signal generators are present, one of which can be switched between two of the three test ports. A mixer, which is connected to a directional coupler, by means of which the wave travelling outwards via the test port or respectively the wave travelling inwards via the test port is de-coupled and fed into the mixer, is provided for each test port. The other input of the mixer is connected to the local oscillator.

With network analyzers and also other measuring instruments, for example, with connected signal generators, it is problematic that a frequency change of the signal generators has to be implemented in a phase-stable manner, that is to say, no sudden phase changes should occur during the frequency change. Signal generators generally comprise synthesisers with several phase-locked-loop (PLL) stages with fractional dividers. A division by a fractional-rational division factor is implemented in the dividers. If the division factor is varied not exclusively with regard to its integer component, this generally leads to a sudden phase change. Even if only the integer division factor is varied, a sudden phase change by $\pi/n$, where n is a whole number, can occur. The necessity for implementing a phase-stable frequency change is relevant particularly when measuring frequency-converting devices under test, such as mixers.

SUMMARY OF THE INVENTION

The invention therefore provides a method for the measurement of devices under test, in which no sudden phase change occurs during the frequency change or in which the sudden phase change is at least registered.

Accordingly, the invention provides a method for the measurement of a device under test, in particular, using a network analyzer, with several test ports, at least one signal generator for the excitation of the device under test and at least one local oscillator for measuring the signal reflected or transmitted from the device under test according to the principle of superposition: characterised in that, in the event of a frequency change, only the frequency of the local oscillator or the frequency of the signal generator is varied, but the frequency of the local oscillator and of the signal generator are not varied simultaneously.

According to the invention, in the event of a frequency change, only the frequency of the local oscillator or the frequency of the signal generator is changed, but the frequency of the local oscillator and the signal generator are not changed simultaneously. This means that any phase changes occurring during the frequency change of the oscillator and during the frequency change of the signal generator can be registered separately from one another and either compensated by adjusting the phase position of the oscillator or respectively the signal generator or can be included in the subsequent evaluation of the measurement.

The local oscillator and the signal generators are generally fitted as synthesisers with one or more PLL stages. A frequency change is then implemented by varying the division factor of the divider provided in the PLL stages. In this context, it is advantageous if initially, only the integer component of the division factor is varied, because no phase displacement is caused as a result. Accordingly, a rough frequency change in the proximity of the new target frequency can be achieved by this means. The fine frequency tuning then required can be implemented by varying the component after the decimal point of the division factor, wherein, according to the invention, only either the frequency of the oscillator or of the signal generator is adjusted, but both frequencies are not adjusted simultaneously, so that the phase change of the oscillator and of the signal generator can be registered separately from one another.

The method according to the invention can be used in a particularly advantageous manner with frequency-converting devices under test, for example, for testing mixers. In this context, two inputs of the frequency-converting device under test must be excited with different frequencies. With a mixer, one input of the mixer should be provided, for example, with a frequency in the high-frequency input bandwidth, while a signal, which serves as a local-oscillator signal for the mixer under test, must be supplied to the other input. The sum or respectively difference frequency from the two input signals, which is disposed in a completely different frequency range, appears at the output of the mixer.

In fact, measurements of mixers with vectorial network analyzers, which are based on reflection measurements including a reference mixer, are already known. In order to implement advantageous transmission measurements, the phase position of the two excitation signals, which are supplied to the mixer, must be accurately known. In the measurement of the output signal, the time position of the phase of the output signal relative to the time position of the phase of the excitation signals is also relevant. The two signal generators required for the excitation of the mixer must therefore be adjusted to a defined phase position relative to one another, and/or the phase position must be accurately known. Accordingly, in order to measure the output signal of the mixer, the relationship of the local oscillator signal, which is used internally within the network analyzer, relative to the generator signals must be accurately known. The method according to the invention for a phase-stable frequency change in adjusting the signal generators or respectively the local oscillator can be used in a particularly advantageous manner in this context.

BRIEF DESCRIPTION OF THE DRAWINGS

An exemplary embodiment of the invention is described in greater detail below with reference to the drawings. The drawings are as follows.

DETAILED DESCRIPTION

Before the method according to the invention is described, an exemplary test structure, in which the method according to the invention can be used advantageously, will be described with reference to FIG. 1. In the exemplary embodiment illustrated in FIG. 1, a frequency-converting device under test, for example, a mixer, is tested using a vectorial network analyzer.

In the exemplary embodiment presented, the first input port E1 of the mixer DUT is a high-frequency input, at which the high-frequency signal RF_DUT is received. The second input port E2 is an input port, at which the local oscillator signal LO_DUT is received. With the test configuration illustrated in FIG. 1, the first input port E1 of the frequency-converting DUT designed as a mixer is connected to the first test port P1 of the network analyzer NA. The second input port E2 of the device under test DUT is connected to the third test port P3 of the network analyzer NA. The mixed-down, intermediate-frequency signal ZF_DUT is connected to the output port A of the device under test DUT. The output port of the device under test DUT is connected to the second test port P2 of the network analyzer NA. The S-parameters $S_{11}$, that is to say, the reflection of the device under test DUT at the test port P1, $S_{33}$, that is to say, the reflection of the device under test DUT at the test port P3, $S_{21}$, that is to say, the transmission through the device under test DUT from the test port P1 to the test port P2, and $S_{23}$, that is to say, the transmission through the device under test DUT from the test port P3 to the test port P2, are particularly relevant in this context.

Figure 1:
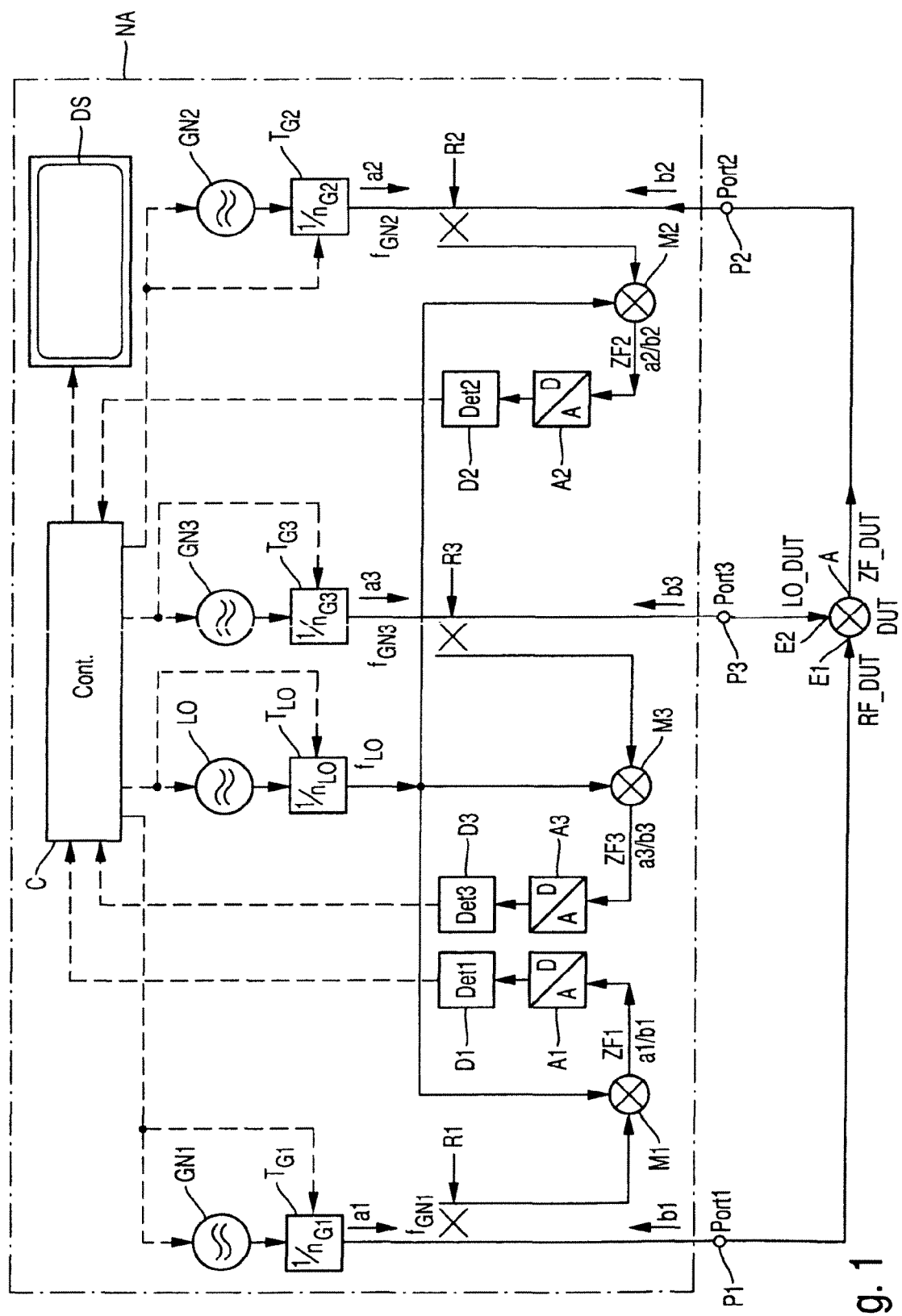
FIG. 1 shows a block circuit diagram of a network analyzer, which can be used within the framework of the invention for testing a mixer.

The network analyzer NA illustrated in FIG. 1 is designed as a conventional multi-port, vectorial network analyzer. FIG. 1 shows only three test ports P1 to P3. Of course, the network analyzer NA can also provide more than three test ports. Several two-port network analyzers can also be connected together in cascade, as illustrated in the priority document DE 10 2006 001 284.

In the exemplary embodiment illustrated in FIG. 1, each test port P1, P2 and P3 provides its own signal generator GN1, GN2 and GN3. However, this need not necessarily be the case. It is also possible, for example, for only two signal generators to be provided one signal generator being switchable between two test ports. Furthermore, in the exemplary embodiment presented, a common local oscillator LO is provided for all test ports P1 to P3. This need not necessarily be the case. With a more complex network analyzer, an individual local oscillator may be provided for each test port P1 to P3, or a local oscillator can supply two test ports respectively in pairs.

The frequency of the signal generators GN1, GN2, GN3 and of the local oscillator LO can be varied respectively via dividers $T_{G1}$, $T_{G2}$, $T_{G3}$ and $T_{LO}$, which form a component of a phase-locked loop according to the PLL principle, and which are indicated only schematically in FIG. 1, being described in greater detail with reference to FIG. 2. The divided-down signal of the signal generators GN1, GN2 and GN3 is supplied respectively to the associated test port P1, P2 and respectively P3. A directional coupler R1, R2 and respectively R3, which de-couples the forward wave a1, a2 and respectively a3 generated by the signal generators GN1, GN2 and GN3 travelling to the test ports P1, P2 and P3 respectively and supplies it respectively to an associated mixer M1, M2 and M3, is disposed between the signal generators GN1 to GN3 and the associated test ports P1 to P3. The return wave b1, b2 and b3 received via the test ports P1, P2 and respectively P3 is also de-coupled via the directional couplers R1, R2 and R3 and supplied to the associated mixer M1, M2 and M3.

The mixers M1, M2 and M3 also each receive the signal of the local oscillator LO, divided down as required in the divider $T_{LO}$. The signal of the forward and return waves mixed down into the intermediate-frequency ranges ZF1, ZF2 and respectively ZF3 is supplied in each case to an analog/digital converter A1, A2, A3, and the digitised signal is registered in a detector D1, D2 or respectively D3 with regard to amplitude and phase. A control device or controller C receives the signals received from the detectors D1 to D3 and is used at the same time to control the signal generators GN1 to GN3, the local oscillator LO and the associated dividers $T_{G1}$, $T_{G2}$, $T_{G3}$ and $T_{LO}$. The S-parameters are calculated from the forward and return waves, for example, in the control device C, and presented on a display DS dependent upon the measured frequency.

Figure 2:
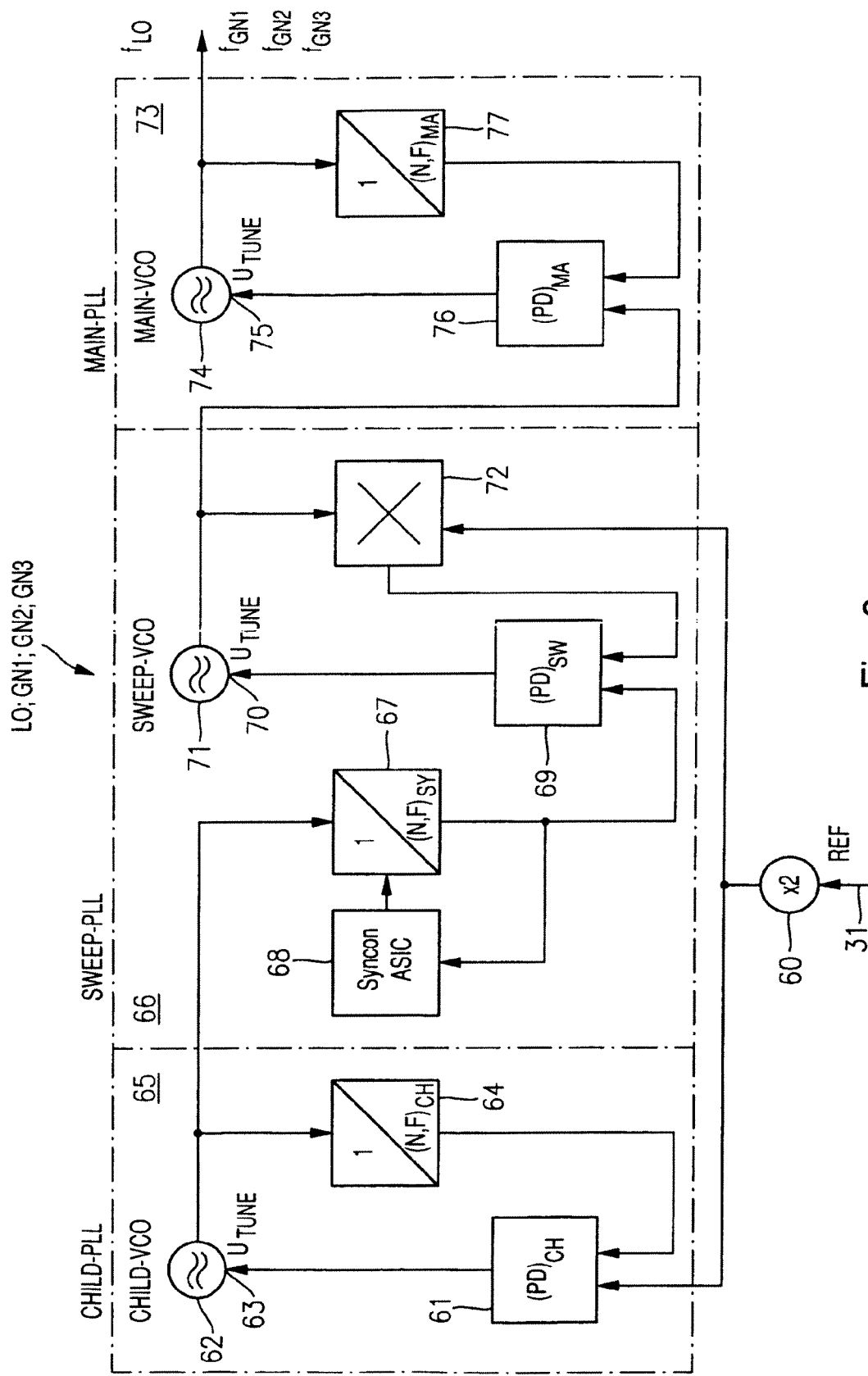
FIG. 2 shows an exemplary embodiment of the internal structure of the local oscillator illustrated in FIG. 1 and the signal generators illustrated in FIG. 1.

An exemplary embodiment of the exact structure of the signal generators GN1 to GN3 and the local oscillator LO is presented in FIG. 2, wherein it is evident that the signal generators GN1 to GN3 and the local oscillator LO are built up with several PLL stages with several dividers 64, 67 and 77.

The reference signal REF is transmitted to the local oscillator LO and/or the signal generators GN1 to GN3 via the connecting line 31. In the exemplary embodiment, the frequency of the reference signal REF is initially doubled within the local oscillator LO or respectively in the signal generators GN1 to GN3 in a frequency doubler 60 and supplied within the local oscillator LO or respectively signal generator to a first comparison input of a first phase detector 61. The output of the first phase detector 61 is connected to the control input 63 of a first oscillator 62. The output of the first oscillator 62 is connected via a first fractional divider 64 to the second comparison input of the first phase detector 61. Consequently, the first oscillator 62 with the divider 64 and the first phase detector 61 forms a first phase-locked loop PLL, which is synchronized with the reference signal REF. This first phase-locked loop in stage 65 is also referred to as Child_PLL. The divider 64 divides the frequency by the fractional-rational division factor $(N.F)_{CH}$ with the integer component N and the non-integer component F after the decimal point.

The stage 66 adjoining the above is referred to as the Sweep_PLL. A second divider 67, which is connected to the output of the first oscillator 62, is provided here. A synchronization component 68 ensures the selection of the fractional-rational division factor $(N.F)_{SY}$ of the divider 67. The output of the second divider 67 is connected to a first comparison input of a second phase detector 69, of which the output is once again connected to the control input 70 of a second oscillator 71. The output of the second oscillator 71 is connected to a first input of a mixer 72. A second input of the mixer 72 receives the reference signal REF doubled by the frequency doubler 60. The output of the mixer 72 is connected to the second comparison input of the second phase detector 69. In this manner, a second phase-locked loop PLL, which is also synchronized via the reference signal REF, is formed by the second oscillator 71, the mixer 72 and the phase detector 69.

A third oscillator 74, of which the control input 75 is connected to a third phase detector 76, is disposed in a third stage 73, which is referred to as the Main_PLL. A first comparison input of the third phase detector 76 is connected to the output of the second oscillator 71, while a second comparison input of the third phase detector 76 is connected via a third divider 77 to the output of the third oscillator 74. The local oscillator signal or respectively generator signal with the frequency $f_{LO}$ or $f_{GN1}$, $f_{GN2}$ or $f_{GN3}$ is available at the output of the third oscillator 74, which is also referred to as the main oscillator. The frequency $f_{LO}$ in this context can be tuned over several octaves. The divider 77 also divides the frequency by a fractional-rational division factor $(N.F)_{MA}$.

In particular, but not exclusively in the case of frequency-converting devices under test DUT, the problem arises that the frequency of the signal generators GN1 to GN3 and of the local oscillator LO must be changed in a phase-stable manner. The testing of the mixer DUT of the exemplary embodiment shown in FIG. 1 is preferably implemented according to the invention as follows:

In the event of an adjustment of the network analyzer NA, the complex parameters of the signal generators GN1 and GN3 at the test ports P1 and P3, namely, the forward waves a1 and a3 and the reflected waves b1 and b3 at these test ports, can only be measured if the frequency in the signal generators GN1 and GN3 is the same within the bandwidth of the intermediate-frequency range ZF1 and respectively ZF3, because the local oscillator LO in the exemplary embodiment is provided only as a single local oscillator at the same measurable, intermediate reception frequency. Similarly, the intermediate frequency of the mixer DUT, or in general, of the frequency-converting device under test, can only be analysed at the test port P2, if the local oscillator LO is adjusted for this reception frequency. Accordingly, it is never possible to measure at the three test ports P1 to P3 with the same adjustment of the signal generators and the local oscillator, that is to say, for each test point, both the signal generator GN3 at the test port P3 and also the local oscillator LO must be adjusted respectively for reception at the test port P2. In this context, the phase relationships must not be lost, because otherwise no information can be provided regarding the phase of the mixer product ZF-DUT generated by the mixer DUT with reference to the phase of the input signals RF_DUT and LO_DUT.

The frequency of the two signal generators GN1 and GN3 at the test ports P1 and P3 is initially adjusted to the same frequency, for example, 1 GHz. Any phase differences in the generators GN1 and GN3 are known from the calibration with calibration standards and can be taken into consideration accordingly. If the mid-frequency of the intermediate-frequency ranges ZF1, ZF2 and respectively ZF3 of the network analyzer NA is, for example, 20 MHz, the frequency of the local oscillator LO is initially disposed, in this example, at 1.020 GHz. The phase difference between the test ports P1 and P3 can now be determined via the wave values a1 and a3 of the forward waves as follows:

$$\phi_{a1} = \phi_{LO} - \phi_{port1} \quad (1)$$

$$\phi_{a3} = \phi_{LO} - \phi_{port3} \quad (2)$$

$$\phi_{a1} - \phi_{a3} = \phi_{port3} - \phi_{port1} \quad (3)$$

The frequency of the signal generator GN3 at the test port P3 must now be brought, through the phase-stable frequency change according to the invention, to the target frequency of the measured signal LO_DUT, which the mixer DUT anticipates at its second input E2. If the intermediate frequency ZF_DUT generated by the mixer DUT is 30 MHz, for example, the frequency error between the signal RF_DUT and the signal LO_DUT must be 30 MHz, and accordingly, the frequency of the signal generator GN3 must be increased from 1 GHz to 1.030 GHz. According to the invention, for this frequency change, only the frequency of the local oscillator LO is varied without a frequency change of the signal generator GN3, and then following this in an alternating manner, only the frequency of the signal generator GN3 but not the frequency of the local oscillator LO is varied. In this context, the step width should be selected to be so small that it is not necessary to leave the bandwidth of the intermediate frequency range ZF3. This procedure must be repeated as often as required until the target frequency, in the example, 1.030 GHz, is finally reached.

By way of example, the frequency of the local oscillator LO is initially increased by 5 MHz from the original 1.020 GHz to the new value of 1.025 GHz. The intermediate frequency of the intermediate-frequency stage ZF3 is therefore now 25 MHz instead of the original 20 MHz. The change in the phase $\Delta\phi_{a3,1}$ of the forward wave a3 at the test port P3 in this first stage is now measured, stored in a memory and taken into consideration in the subsequent evaluation. Alternatively, this can also be compensated directly by changing the phase of the local oscillator LO by the same phase-change value $\Delta\phi_{LO} = \Delta\phi_{a3,1}$.

The frequency of the signal generator GN3 at the test port P3 is now increased, for example, by 10 MHz from the original 1.000 GHz to the new value of 1.010 GHz, so that a new intermediate frequency within the intermediate-frequency range ZF3 from 1025 MHz−1010 MHz=15 MHz is adjusted. The phase change $\Delta\phi_{a3,2}$ of the forward wave a3 at the test port P3 obtained as a result is once again measured and stored.

The frequency of the local oscillator LO is now adjusted upwards by a further 10 MHz to 1.035 GHz. The frequency of the intermediate-frequency signal in the intermediate-frequency range ZF3 is now once again 25 MHz. The associated phase change $\Delta\phi_{a3,3}$ is once again registered and stored. After this, the frequency of the signal generator GN3 at the test port P3 is again adjusted by a further 10 MHz to the new value of 1.020 GHz, so that, once again, an intermediate frequency of 15 MHz is obtained. The phase change $\Delta\phi_{a3,4}$ associated with this step is also registered and stored. It must be emphasized, that the bandwidth of the intermediate-frequency range ZF3 and also all other intermediate-frequency ranges ZF1 and ZF2 is significantly broader than 5 MHz, that the resulting intermediate frequencies of 15 MHz and also of 25 MHz are disposed within the bandwidth extending around the mid-frequency of 20 MHz.

This procedure is repeated until the frequency of the signal generator GN3 is disposed at 1.030 GHz, and the associated frequency of the local oscillator is disposed at 1.050 GHz. In this context, a step width of 5 MHz is selected instead of 10 MHz, so that the frequency of the intermediate-frequency signal in the intermediate-frequency range ZF3 resulting after the last step is once again 20 MHz.

The decisive advantage of the procedure described above is that the phase difference $\Delta\phi$ between the excitation signals at the test port P3 and the test port P1 is now known. It is now:

$$\Delta\varphi_{31} = \varphi_{port3} - \varphi_{port1} + \sum_i \Delta\varphi_{port3,i} \quad (4)$$

wherein $\phi_{port3} - \phi_{port1}$ was the phase difference originally determined according to equation (3) between the test ports P3 and P1 before increasing the frequency of the signal generator GN3. The overall change $\Delta\phi_{LO}$ of the phase position of the local oscillator LO by comparison with the original phase position of the local oscillator $\phi_{LO}$ is known to be:

$$\Delta\varphi_{LO} = \sum_i \Delta\varphi_{LO,i} \quad (5)$$

The adjustment of the local oscillator LO and the signal generator GN3 could, of course, also be implemented in the reverse sequence, that is to say, it is possible to begin with the signal generator GN3, wherein the concluding stage would be increasing the frequency of the local oscillator LO. The properties of the device under test have no influence on the phase position, because only the forward waves a1 and a3, but not the return waves b1 and b3 reflected from the device under test are used.

The method described above is referred to within the framework of the present application as the Secum-Trahenz method.

The frequency of the local oscillator LO must now be adjusted in such a manner that the intermediate frequency adjusted at the test port P2 at the output of the mixer M2 falls within the bandwidth of the intermediate-frequency range ZF2.

At its output port A, the mixer device under test DUT generates a signal ZF_DUT, of which the frequency corresponds to the difference between the frequencies of the signals RF_DUT and LO_DUT. In the example described above, with a frequency of the signal LO_DUT of 1.030 GHz and a frequency of the signal RF_DUT of 1.000 GHz, a frequency difference of 30 MHz is obtained, which should be analysed with regard to amplitude and phase at the test port P2.

In order to provide information about the phase of the signal ZF_DUT, the frequency of the local oscillator LO must now be adjusted from 1.050 GHz in a phase-stable manner to 50 MHz, so that the anticipated frequency of 30 MHz of the signal ZF_DUT falls in the middle of the bandwidth of the intermediate-frequency range ZF2 of 20 MHz. In principle, this can be implemented with the Secum-Trahenz method described above. The adjustment from 1.050 GHz to 50 MHz necessitates an adjustment of 1 GHz, which, with a step width of 10 MHz would require 202 individual steps in order to adjust the local oscillator LO and the signal generator GN2. Without further measures, the adjustment with the Secum-Trahenz method would therefore be relatively time-consuming.

Accordingly, it is advantageous initially to adjust only the integer components with the dividers of the synthesiser in the local oscillator LO shown in FIG. 2, because this has no influence on the phase positions. Accordingly, in a first stage, only the integer component N of the fractional-rational division factor $(N.F)_{CH}$ of the divider 64 of the Child-PLL in stage 65, of the division factor $(N.F)_{SY}$ of the divider 67 of the Sweep-PLL in stage 66 and of the division factor $(N.F)_{MA}$ of the divider 77 of the Main-PLL stage 73 should preferably be changed. After this rough tuning, the frequency $f_{LO}$ at the output of the local oscillator LO will already be disposed in the proximity of the target frequency of 50 MHz.

In a subsequent fine-tuning stage, the F components after the decimal point of the division factors $(N.F)_{CH}$, $(N.F)_{SY}$ and $(N.F)_{MA}$ should then be changed stepwise in such a manner that the exact target frequency of 50 MHz is reached. This fine tuning is then implemented using the Secum-Trahenz method described above with small step widths, for example, once again of 10 MHz.

The fine tuning according to the Secum-Trahenz method can also be omitted as required, if a sufficiently-fine tuning raster is achieved merely by changing the integer components of the division factors ensuring that the signal ZF_DUT received at the port P2 after mixing with the signal of the local oscillator LO in the mixer M2 falls within the bandwidth of the intermediate-frequency range ZF2. In this case, a network analyzer can be used, which provides only two signal generators GN1 and GN3 instead of the three signal generators required for the signals at the test ports P1 and P3. Accordingly, the Secum-Trahenz method cannot be used at test port P2 because of the absence of a signal generator GN2. By way of example, switching the integer component N of the division factor $(N.F)_{MA}$ at the Main-PLL stage 73 from 4 to 128 would change the original frequency $f_{LO}$ of the local oscillator LO from 1050 MHz to 1050 MHz·4/128=32.8125 MHz. Accordingly, a mixing in the mixer M2 with the frequency 30 MHz of the received signal ZF_DUT would lead to an intermediate frequency of 32.8125 MHz−30 MHz=2.8125 MHz, which falls within the bandwidth of the intermediate-frequency range ZF2, which is substantially not limited in the downward direction.

A third possibility for overcoming the large, sudden frequency change, in the example, from 1.050 GHz to approximately 50 MHz, is provided by a measurement of the harmonic or sub-harmonic of the fundamental frequency $f_{LO}$ of the local oscillator LO. In this context, the frequency of the local oscillator LO is left at the setting, at which the phase relation was determined according to the Secum-Trahenz method; however, the measurement is made at a receiver frequency, for example, of $f_{LO}/9$, with the deduction of the device intermediate frequency, in the above example, 20 MHz.

The invention is not restricted to the exemplary embodiment described above. In particular, the method according to the invention can also be used with network analyzers comprising more than three test ports and with less than one signal generator per test port. Furthermore, the method is, in principle, not restricted to network analyzers and can also be used with other devices, for example, with signal generators, wherein the use is not restricted to the testing of frequency-converting devices.

The invention claimed is:

1. Method for the measurement of a device under test using a network analyzer with several test ports, at least one signal generator for the excitation of the device under test and at least one local oscillator for measuring the signal reflected or transmitted from the device under test according to the principle of superposition, the method comprising:
   in the event of a frequency change, varying the frequency of the signal generator and the frequency of the local oscillator successively in an alternating manner, wherein, in the event of a change of the frequency of the signal generator, the frequency of the local oscillator remains unchanged and, in the event of a change of the frequency of the local oscillator, the frequency of the signal generator remains unchanged; and
   registering the phase change associated with the frequency change of the signal generator or respectively of the local oscillator by measuring the phase change of the superposed signal from the generator signal of the signal generator and the oscillator signal of the local oscillator.

2. Method according to claim 1, comprising correcting the difference in the phase position before and after the frequency change by adjusting the phase position of the local oscillator and/or of the signal generator.

3. Method according to claim 1, further comprising correcting the difference in the phase position before and after the frequency change during the evaluation of the measured signal.

4. Method for the measurement of a device under test using a network analyzer with several test ports, at least one signal generator for the excitation of the device under test and at least one local oscillator for measuring the signal reflected or transmitted from the device under test according to the principle of superposition, wherein the local oscillator and each signal generator comprises at least one phase-locked loop with at least one divider, which implements a frequency division with a fractional-rational division factor, the method comprising:

in the event of a frequency change, varying only the frequency of one but not both of the local oscillator or the frequency of the signal generator;

in the event of a rough frequency change, initially varying the integer component of the division factor of the local oscillator and also of the signal generator; and in the event of a subsequent fine frequency change, varying the non-integer component of the division factor of the local oscillator, while the non-integer component of the division factor of the signal generator remains unchanged; and then, by way of alternation, varying only the non-integer component of the division factor of the signal generator, while the non-integer component of the division factor of the local oscillator remains unchanged.

5. Method for the measurement of a device under test using a network analyzer with several test ports, at least one signal generator for the excitation of the device under test and at least one local oscillator for measuring the signal reflected or transmitted from the device under test according to the principle of superposition, wherein the device under test is a frequency-converting device, and the network analyzer has at least three test ports, the method comprising:

supplying the device under test respectively via two test ports with a generator signal of a signal generator;

measuring the frequency-converted signal of the device under test at the third test port;

initially operating the first signal generator and the second signal generator at the same frequency;

supplying a first input port of the frequency-converting device under test by a first signal generator of the first test port of the network analyzer;

supplying a second input port of the frequency-converting device under test by a second signal generator of a second test port of the network analyzer; and measuring the frequency-converted signal of an output port of the frequency-converting device under test at a third test port of the network analyzer;

registering a first superposed signal from the generator signal of the first signal generator and the oscillator signal of the local oscillator and a second superposed signal from the generator signal of the second signal generator and the oscillator signal of the local oscillator; and in the event of a frequency change, varying only the frequency of one but not both of the local oscillator or the frequency of the signal generator.

6. Method according to claim 5, further comprising:

then varying the frequency of the generator signal of the second signal generator and the frequency of the local oscillator successively in an alternating manner, wherein, in the event of a change of the frequency of the second signal generator, the frequency of the local oscillator remains unchanged and, in the event of a change of the frequency of the local oscillator, the frequency of the second signal generator remains unchanged; and registering the phase change associated with each frequency change of the second signal generator by measuring the phase change of the superposed signal from the generator signal of the second signal generator and the oscillator signal of the local oscillator.

7. Method according to claim 5, further comprising:

then varying the frequency of the generator signal of a third signal generator and the frequency of the local oscillator successively in an alternating manner, wherein, in the event of a change of the frequency of the third signal generator, the frequency of the local oscillator remains unchanged, and, in the event of a change of the frequency of the local oscillator, the frequency of the third signal generator remains unchanged; and registering the phase change associated with each frequency change of the local oscillator by measuring the phase change of the superposed signal from the generator signal of the third signal generator and the oscillator signal of the local oscillator.

8. Method according to claim 5, wherein the local oscillator comprises at least one phase-locked loop with at least one divider, which implements a frequency division with a division factor, and in the event of a frequency change of the local oscillator, only the integer component of the division factor is varied.

* * * * *

UNITED STATES PATENT AND TRADEMARK OFFICE
CERTIFICATE OF CORRECTION

PATENT NO. : 8,022,687 B2
APPLICATION NO. : 12/063752
DATED : September 20, 2011
INVENTOR(S) : Georg Ortler Page 1 of 1

It is certified that error appears in the above-identified patent and that said Letters Patent is hereby corrected as shown below:

On the Cover Page:

At field (30), first reference, "10 2006 001 284" should be -- 10 2006 001 284.4 --.

At field (30), second reference, "10 2006 007 042" should be -- 10 2006 007 042.9 --.

At field (30), third reference, "10 2006 017 018" should be -- 10 2006 017 018.0 --.

Signed and Sealed this
Second Day of April, 2013

Teresa Stanek Rea
*Acting Director of the United States Patent and Trademark Office*